(12) United States Patent
Mironescu et al.

(10) Patent No.: US 7,500,590 B2
(45) Date of Patent: Mar. 10, 2009

(54) MULTI-PART CAPILLARY

(75) Inventors: Dan Mironescu, Yoqneam Illit (IL); Ziv Atzmon, Zichron Ya'akov (IL); Gil Perlberg, Zichron Ya'akov (IL)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 84 days.

(21) Appl. No.: 11/764,308

(22) Filed: Jun. 18, 2007

(65) Prior Publication Data

US 2008/0073406 A1 Mar. 27, 2008

(51) Int. Cl.
*B23K 37/00* (2006.01)
(52) U.S. Cl. .................................. 228/4.5; 228/180.5
(58) Field of Classification Search ................. None
See application file for complete search history.

(56) References Cited

U.S. PATENT DOCUMENTS

| | | | |
|---|---|---|---|
| 3,695,502 A | 10/1972 | Gaiser | |
| 3,917,148 A | 11/1975 | Runyon | |
| 3,971,499 A * | 7/1976 | Goodrich et al. | 228/54 |
| 4,020,543 A | 5/1977 | Pennings | |
| 4,315,128 A | 2/1982 | Matcovich et al. | |
| 4,405,074 A | 9/1983 | Levintov et al. | |
| 4,415,115 A | 11/1983 | James | |
| 4,513,190 A | 4/1985 | Ellett et al. | |
| 4,667,867 A | 5/1987 | Dobbs et al. | |
| 4,691,854 A | 9/1987 | Haefling et al. | |
| 5,217,154 A | 6/1993 | Elwood et al. | |
| 5,421,503 A | 6/1995 | Perlberg et al. | |
| 5,437,405 A * | 8/1995 | Asanasavest | 228/180.5 |
| 5,495,976 A | 3/1996 | Mironescu et al. | |
| 5,558,270 A | 9/1996 | Nachon et al. | |
| 5,662,261 A | 9/1997 | Fogal et al. | |
| 5,871,141 A | 2/1999 | Hadar et al. | |
| 5,890,643 A | 4/1999 | Razon et al. | |
| 5,931,368 A * | 8/1999 | Hadar et al. | 228/4.5 |
| 5,954,260 A * | 9/1999 | Orcutt | 228/1.1 |
| 6,073,827 A | 6/2000 | Razon et al. | |
| 6,158,647 A | 12/2000 | Chapman et al. | |
| 6,171,456 B1 | 1/2001 | Hadar et al. | |
| 6,321,969 B1 | 11/2001 | Miller | |
| 6,354,479 B1 * | 3/2002 | Reiber et al. | 228/4.5 |
| 6,499,648 B2 | 12/2002 | Shieh et al. | |

(Continued)

FOREIGN PATENT DOCUMENTS

GB   WO01/82362  A2   11/2001

(Continued)

OTHER PUBLICATIONS

Dictionary.com, Polygon (online), Dictionary.com unabridged (v1.1), Random House, Inc., 2006 (retrieved on Apr. 26, 2007), Retrieved on the internet : <URL:http://dictionary.reference.com/browse/polygonal>.

(Continued)

*Primary Examiner*—Kiley Stoner
(74) *Attorney, Agent, or Firm*—Christopher M. Spletzer, Sr.

(57) ABSTRACT

A bonding tool for bonding a wire to a substrate. The bonding tool has a cylindrical body portion formed from a first material and a conical tip portion separately formed from a second material. The conical tip portion is coupled to one end of the body portion.

24 Claims, 14 Drawing Sheets

U.S. PATENT DOCUMENTS

| | | | |
|---|---|---|---|
| 6,523,733 B2 * | 2/2003 | Miller et al. | 228/4.5 |
| 6,715,658 B2 * | 4/2004 | Perlberg et al. | 228/4.5 |
| 6,729,527 B2 * | 5/2004 | Sonnenreich et al. | 228/4.5 |
| 6,910,612 B2 | 6/2005 | Perlberg et al. | |
| 6,966,480 B2 | 11/2005 | Chapman et al. | |
| 7,004,369 B2 | 2/2006 | Perlberg et al. | |
| 7,077,304 B2 | 7/2006 | Sonnenreich et al. | |
| 7,083,077 B2 | 8/2006 | Wildner | |
| 7,137,547 B2 | 11/2006 | Wakefield | |
| 7,249,702 B2 | 7/2007 | Mironescu et al. | |
| 7,322,507 B2 * | 1/2008 | Kim et al. | 228/1.1 |
| 2002/0079349 A1 * | 6/2002 | Macover | 228/4.5 |
| 2002/0100790 A1 * | 8/2002 | Sonnenreich et al. | 228/4.5 |
| 2002/0158374 A1 * | 10/2002 | Billiet et al. | 264/669 |
| 2005/0252950 A1 | 11/2005 | Eder et al. | |
| 2006/0175584 A1 * | 8/2006 | Kwon et al. | 252/520.2 |
| 2006/0261827 A1 * | 11/2006 | Cooper et al. | 324/754 |
| 2007/0085085 A1 * | 4/2007 | Reiber | 257/79 |

FOREIGN PATENT DOCUMENTS

JP          363090836 A  *  4/1988

OTHER PUBLICATIONS

Dictionary.com, Planar (online), Dictionary.com unabridged (v1.1), Random House, Inc., 2006 (retrieved Feb. 20, 2007), Retrieved on the internet: <URL:http://dictionary.reference.com/browse/planar> definition No. 2 of dictionary.com Unabridged (v1.1).

Thesaurus.com, Planar (online), Roget's New Millennium Thesaurus First Edition (v1.3.1), Lexico Publishing Group, LLC., 2007 (Retrieved Feb. 20, 2007), Retrieved on the internet: <URL:http://thesarus.reference.com/browse/planar>.

West-bond Model 7400E Series, http://www.westbond.com/new7ke.htm, Apr. 17, 1998, pp. 1-2.

* cited by examiner

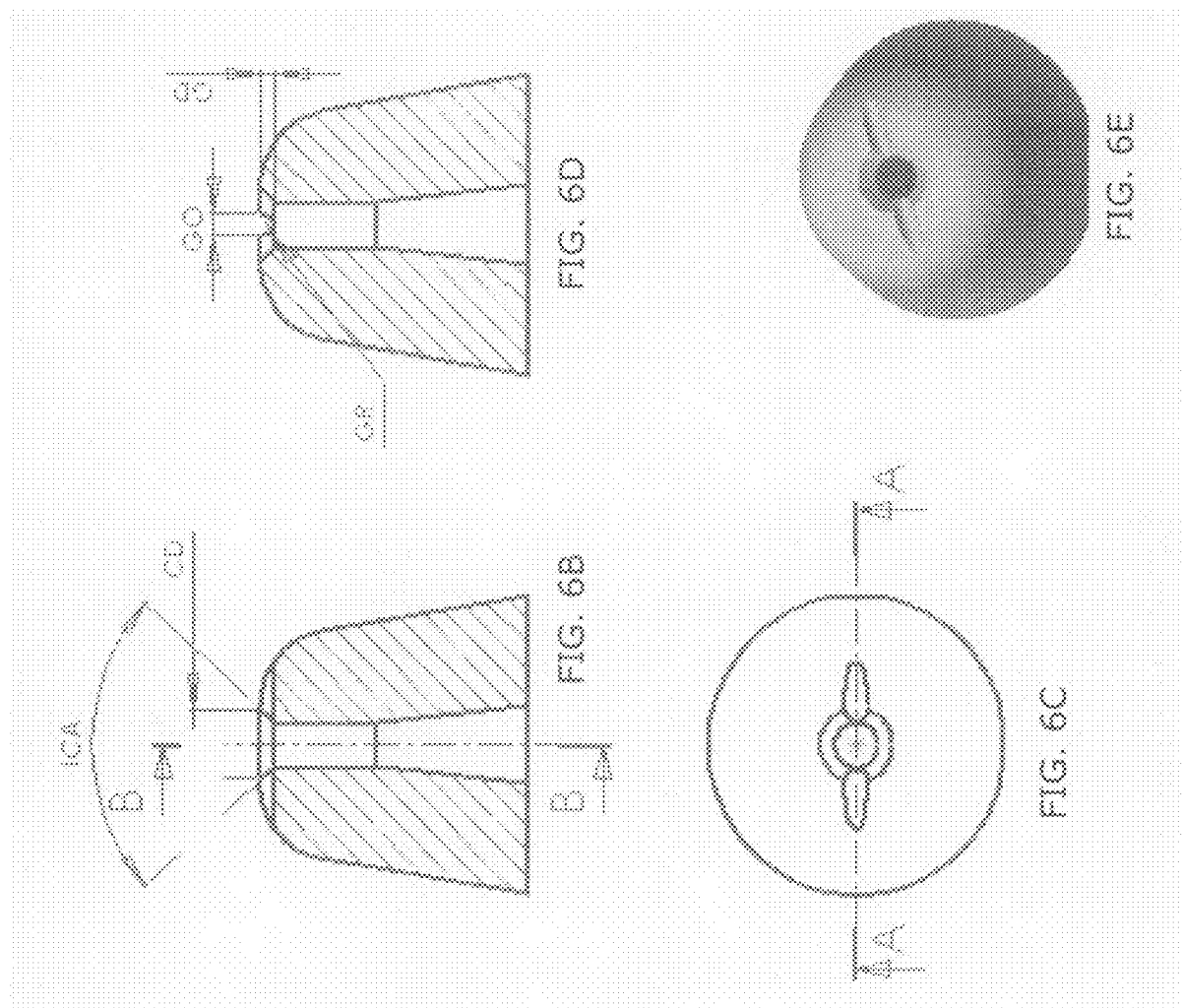

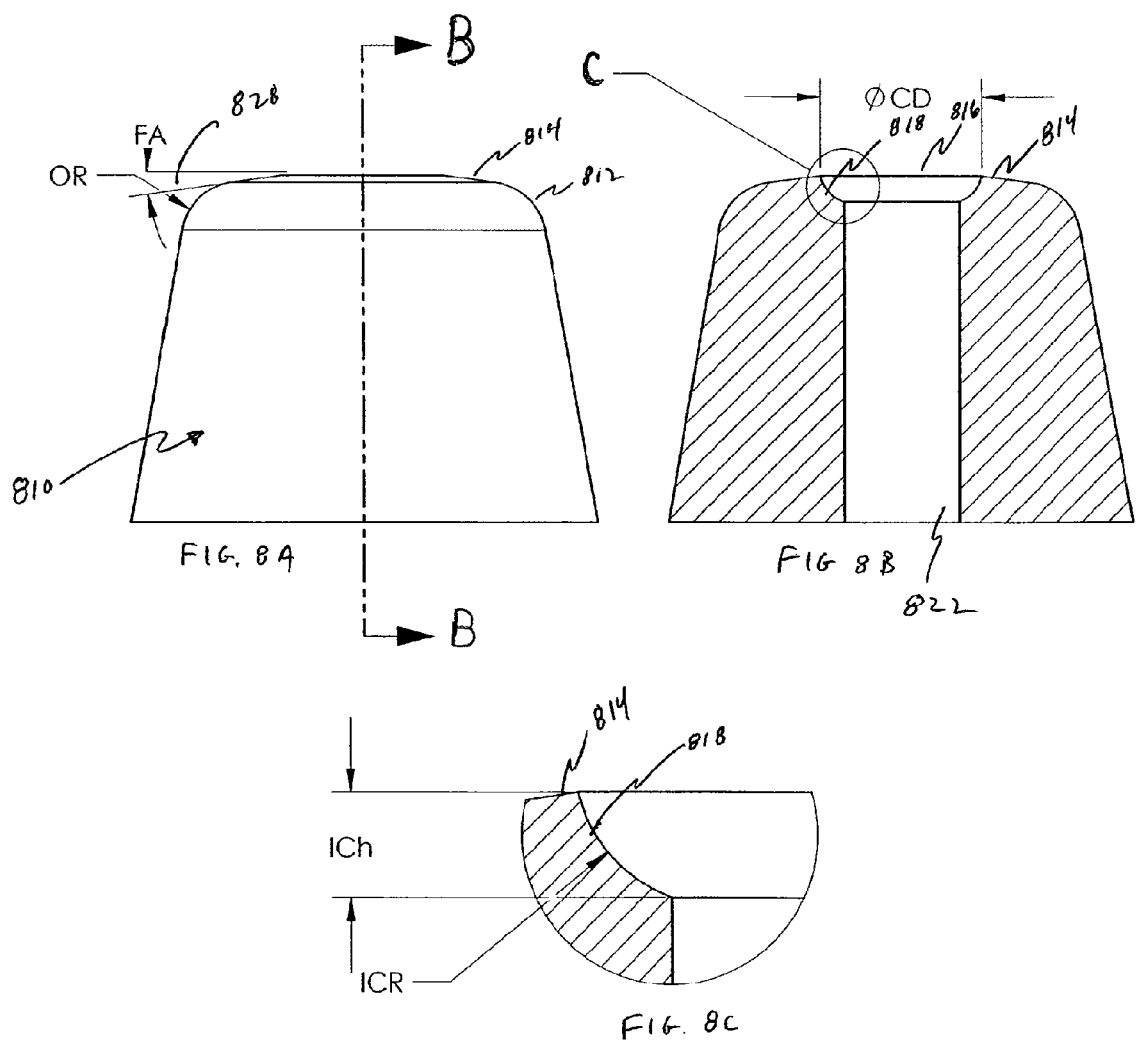

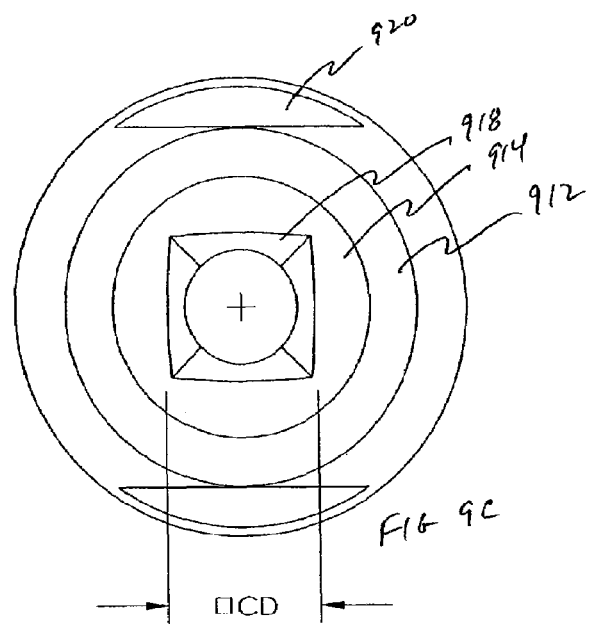
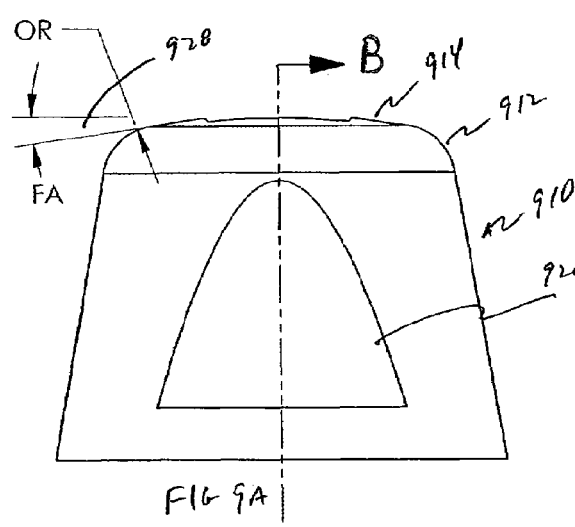
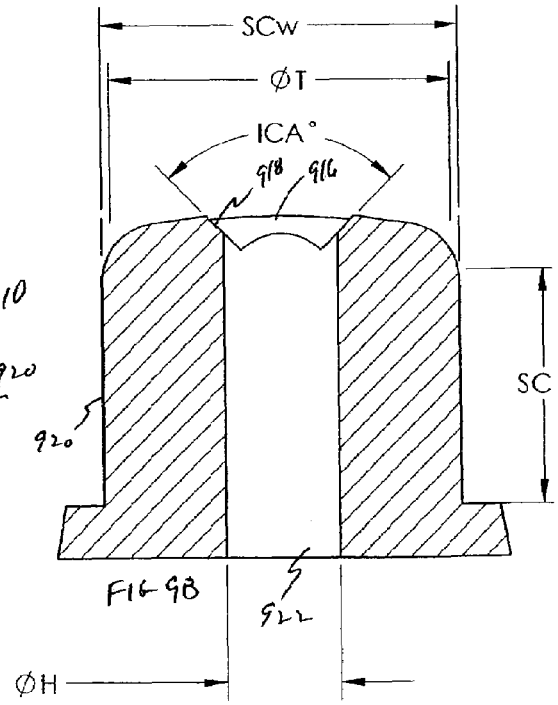

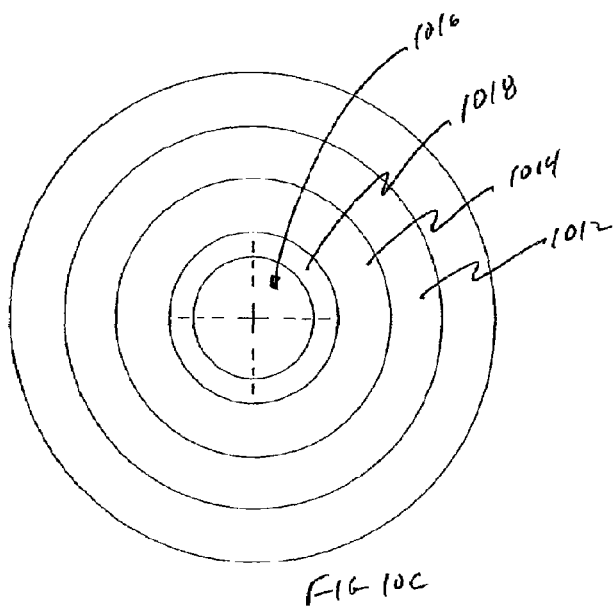
FIG 10C
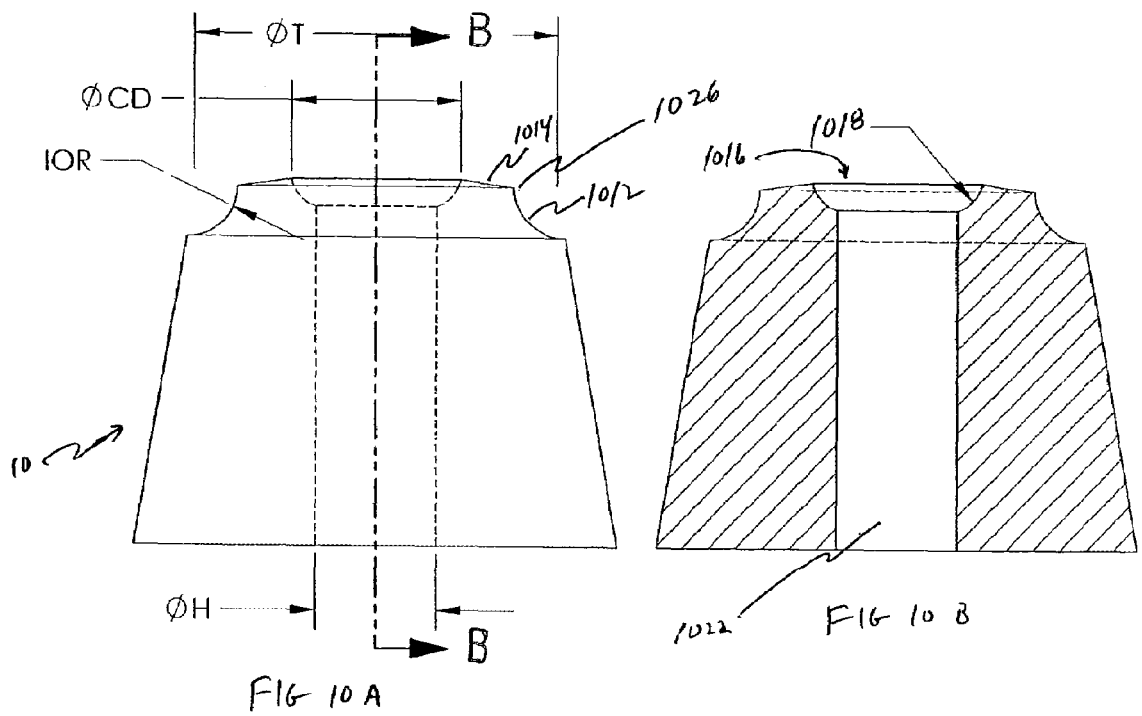
FIG 10A
FIG 10B

MULTI-PART CAPILLARY

CROSS REFERENCE TO RELATED APPLICATIONS

This application claims the benefit of priority to U.S. patent application Ser. No. 11/004,772, filed Dec. 3, 2004, which claims priority to U.S. Provisional Patent Application No. 60/526,896, filed on Dec. 4, 2003, the contents of both which are incorporated herein by reference.

FIELD OF THE INVENTION

This invention generally relates to a bonding tools used for fine wire bonding, and more particularly to a capillary bonding tool formed from multiple and different materials.

BACKGROUND OF THE INVENTION

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, and the top surface of the chip facing away from the top surface of the substrate. Fine wires (which may be aluminum copper or gold wires) are connected between the contacts on the top surface of the chip and the contacts on the top surface of the substrate. Particularly, the connecting wires are supplied and bonded to the chip and to the substrate through a capillary, a bonding tool further described below.

Capillaries (bonding tools) are used for ball bonding the wire to electronic devices, particularly to bond pads of semiconductor devices. Such capillaries are generally formed from a ceramic material, principally aluminum oxide, tungsten carbide, titanium carbide, cermets, ruby, zircon toughened alumina (ZTA), alumina toughened zircon (ATZ). Very thin wire, generally on the order of about one mil gold, copper or aluminum wire, is threaded through an axial passage in the capillary with a small ball being formed at the end of the wire, the ball being disposed external of the capillary tip. The initial object is to bond the ball to a pad on the semiconductor device and then to bond a portion farther along the wire to a lead frame or the like. During the bonding cycle, the capillaries perform more than one function.

After the ball is formed, the capillary must first center the ball partly within the capillary for bond pad targeting. With a first bonding step, the ball is bonded to a pad on a semiconductor device. When the capillary touches the ball down on the bond pad, the ball will be squashed and flatten out. As the bond pads are generally made from aluminum, a thin oxide forms on the surface of the bond pad. In order to form a proper bond, it is preferable to break the oxide surface and expose the aluminum surface. An effective way of breaking the oxide is to "scrub" the surface of the oxide with the wire ball. The wire ball is placed on the surface of the aluminum oxide and the capillary rapidly moves in a linear direction based on the expansion and contraction of a piezo-electric element placed within the ultrasonic horn to which the capillary is attached. The rapid motion, in addition to heat applied through the bond pad, forms an effective bond by transferring molecules between the wire and the bond pad.

The capillary then handles the wire during looping, smoothly feeding the bond wire both out of the capillary and then back into the capillary. The capillary then forms a "stitch" bond and a "tack" or "tail" bond.

Presently, thermosonic wire bonding is the process of choice for the interconnection of semiconductor devices to their supporting substrates. The thermosonic bonding process is partially dependent upon the transfer of ultrasonic energy from the transducer, attached to a movable bondhead, through a tool, e.g. capillary or wedge, to the ball or wire being welded to the semiconductor device or supporting substrate.

FIG. 1 is an illustration of a well-known prior art fine pitch bonding tool 100. As shown in FIG. 1, bonding tool 100 is formed from a unitary piece of material having a cylindrical portion 101, a tapered portion 102 coupled between cylindrical portion 101, and working tip 104. To meet the requirement of electrical isolation between the bonding machine and the device being fabricated, the material used to form bonding tool 100 is non-conductive. Typically, this non-conductive material is a brittle ceramic based compound such as alumina, for example.

U.S. Pat. Nos. 5,871,141, 5,558,270, and 5,421,503 assigned to the same assignee as the present invention, describe various conventional bonding tools for producing wire bonds on semiconductor devices and are incorporated herein by reference.

Conventional bonding tools are formed from non-conductive materials, such as alumina, and include a working tip used to form the bonds between the contact pad and the bonding wire. Such non-conductive bonding tools are necessary in order to protect the substrate being bonded from potential electrical discharges from the bonding machine. Conventional bonding tools are deficient, however, because the ceramic materials from which they are formed are brittle and do not lend themselves to be fabricated with working tip features that allow them to form bonds in ultra fine pitch applications so as to provide a high level of inter metallic coverage between the bonding ball formed by the tool and the bonding pad. Furthermore, conventional bonding tools are formed as a unitary part. It use, however, only the working tip of the capillary becomes worn, but requires the replacement of the entire part, thereby wasting valuable material. Further, it is more difficult to manufacture such a unitary bonding tool. For ease of manufacturing and/or replacement purposes, it would advantageous to provide a bonding tool where the working tip is separate from the shaft.

The inventors of the present invention have developed a bonding tool that meets the demands imposed by these high-density devices while maintaining structural integrity of the bonding tool.

SUMMARY OF THE INVENTION

In view of the shortcomings of the prior art, the present invention relates to a bonding tool having a body portion formed from a first non-conductive material; and a working tip formed from a second material having a conductive property, a first end of the working tip coupled to one end of the body portion.

According to another aspect of the present invention, the face of the working tip has a circular profile, a square profile, or a rectangular profile.

According to yet another aspect of the present invention, a working tip of a bonding tool for use with a bonding machine is provided. The working tip comprises an orifice extending in a longitudinal direction along a central portion of the working tip; an inner chamfer coupled to an end of the orifice, the inner chamfer having a substantially arcuate profile; and a exterior planar portion coupled to an end of the inner chamfer.

According to yet a further aspect of the present invention, the working tip comprises an orifice extending in a longitudinal direction along a central portion of the working tip; a plurality of substantially planar faces formed at an inner portion of the working tip to form an inner chamfer having a polygonal shape; and a exterior planar portion coupled to respective ends of each of plurality of substantially planar faces.

According to still another aspect of the present invention, the working tip comprise, an orifice extending in a longitudinal direction along a central portion of the working tip; an inner chamfer having a first end coupled to an end of the orifice; a exterior planar portion having a first end coupled to a second end of the inner chamfer; and a further exterior portion coupled to a second end of the exterior planar portion, the further exterior portion disposed coaxially with the orifice and having a portion with a concave profile extending from the exterior planar portion.

The present invention also relates to a method of manufacturing a bonding tool for bonding a fine wire to a substrate, comprising the steps of forming a cylindrical body from a non-conductive material; forming a substantially conical body from a conductive material; joining the cylindrical body to the conical body; and forming an orifice extending from an end of the cylindrical body to a tip of the conical body.

These and other aspects will become apparent in view of the detailed description below.

BRIEF DESCRIPTION OF THE DRAWINGS

The invention is best understood from the following detailed description when read in connection with the accompanying drawings. It is emphasized that, according to common practice, the various features of the drawing are not to scale. On the contrary, the dimensions of the various features are arbitrarily expanded or reduced for clarity. Included in the drawing are the following Figures:

FIG. 6A-6I illustrate various working tips that may be provided in the end portion of the exemplary bonding tool according to the present invention;

FIGS. 8A-8C illustrate an exemplary bonding tool tip according to an exemplary embodiment of the present invention;

FIG. 9 illustrates an exemplary bonding tool tip according to another exemplary embodiment of the present invention;

FIG. 10 illustrates an exemplary bonding tool tip according to yet another exemplary embodiment of the present invention.

DETAILED DESCRIPTION OF THE INVENTION

To overcome the aforementioned deficiencies, the present invention provides a multipart capillary (bonding tool) in which the shaft is formed separately from the working tip and subsequently attached thereto. The present invention also provides a multipart capillary (bonding tool) in which the shaft is formed from a non-conductive material and the conical tip is formed from a conductive material capable of being machined with the desired features.

Figure 1:
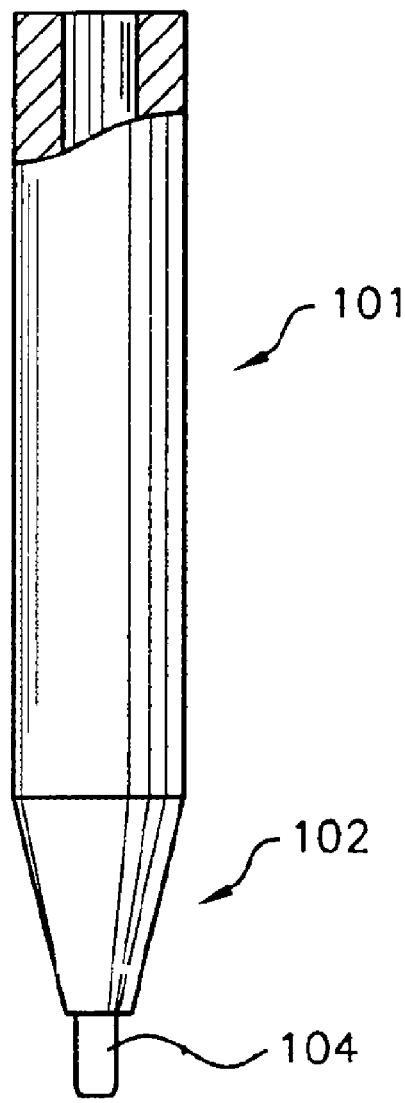
FIG. 1 is a cross sectional view of a conventional bonding tool.
Figure 2A:
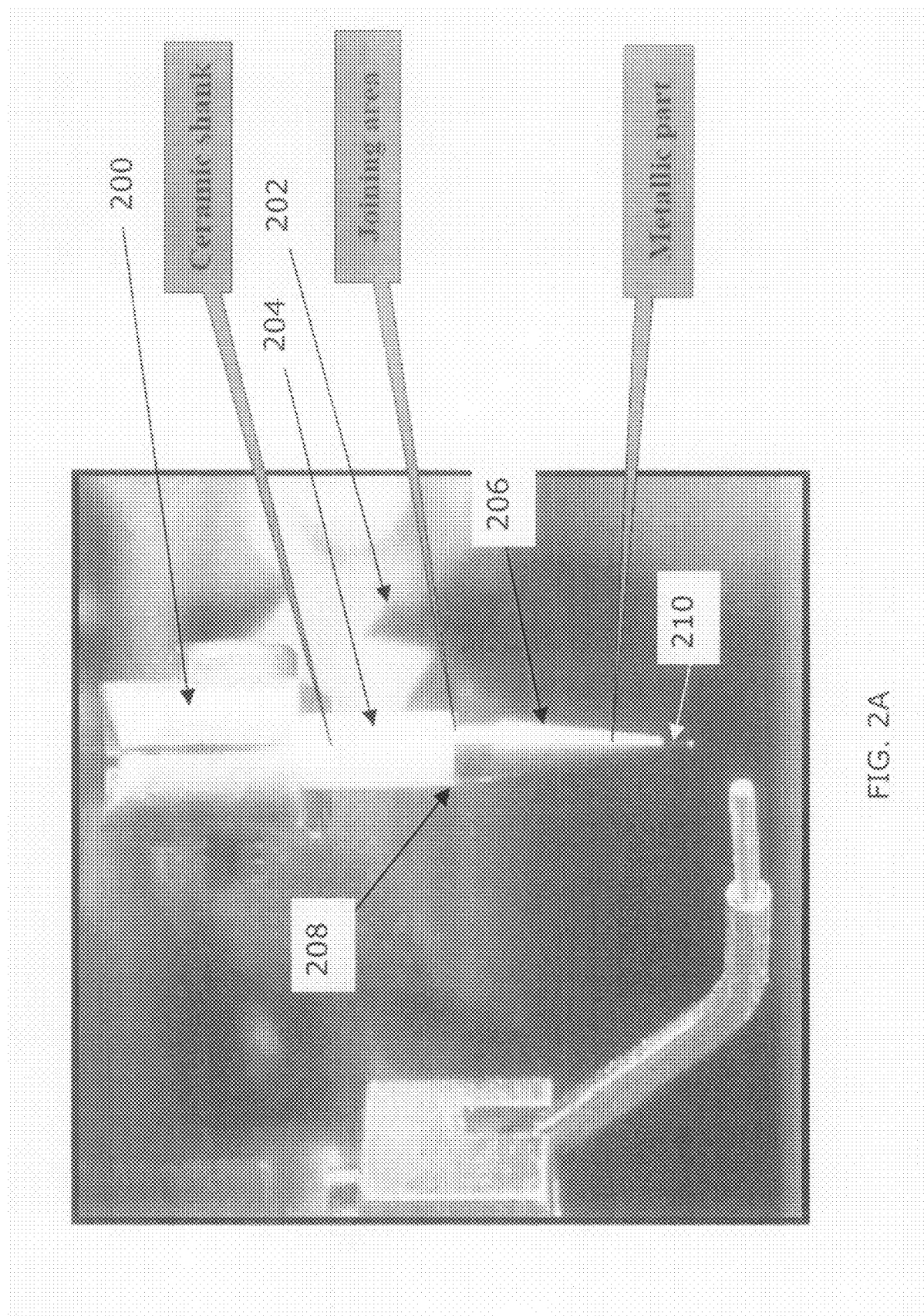
FIGS. 2A-2B are various views of a bonding tool according to a first exemplary embodiment of the present invention.

FIG. 2A is a side view of a bonding tool according to a first exemplary embodiment of the present invention. As shown in FIG. 2A, bonding tool 202 is coupled to ultrasonic bond head 200 of a bonding machine (not shown). Bonding tool 202 is comprised of shaft portion 204, formed from a non-conductive material, such as alumina, and a conical portion 206 having a tip portion 210. Conical portion 206 and tip portion 210 formed from a material having a conductive property, such as a metallic based material, and preferably formed as a unitary part. The shaft portion 204 and conical portion 206 are joined to one another at interface 208 using any one of a variety of well-known means, such as an adhesive, brazing, heat and pressure, or threads for example. Conical portion 206 and tip portion 210, being formed from a metallic based material, allows it to be machined easily to incorporate features necessary to form bonds useful in various bonding applications, including ultra-fine pitch bonding. Metals, being malleable, also have certain resistance to cracking and breakage as compared to brittle materials, such as ceramics and, as such, are ideal in forming bonding tips with ultra-fine pitch features. An additional advantage is that conical portion 206 may be replaced as it wears out and reusing shaft portion 204 if desired.

Figure 2B:
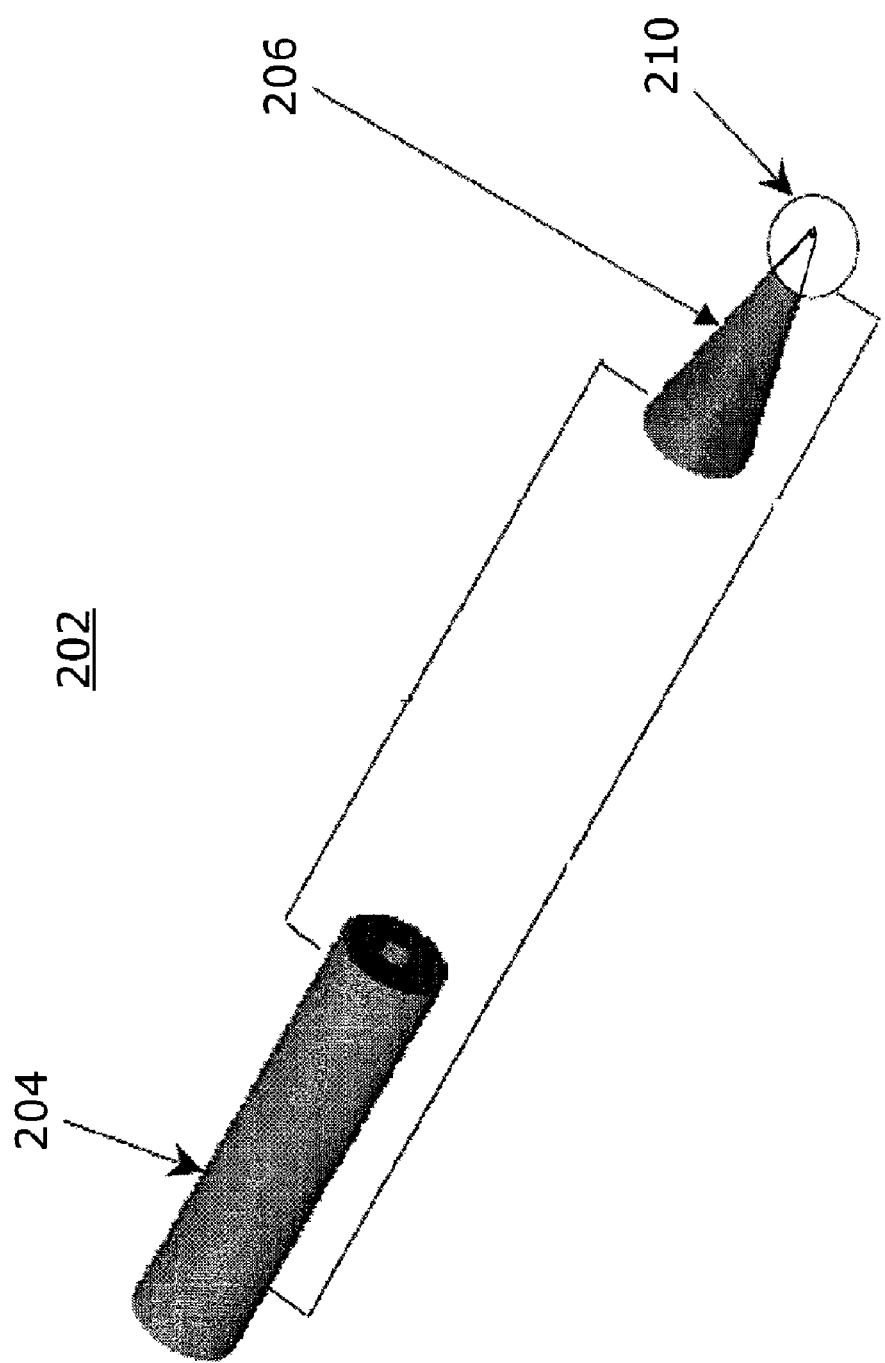

FIG. 2B is a perspective view of the parts used to form bonding tool 202. As shown in FIG. 2B, shaft (shank) portion 204 is formed from a well-known ceramic, such as alumina. Conical portion 206 and tip portion 210 are formed from any one of a number of materials having conductive properties, such as Titanium carbide (TiC), TiC based cermet, TiCN, TiN in combination with Si3N4, and Piezo-electric crystals, for example. The machining of shaft 204, conical portion 206 and tip portion 210 may be accomplished using conventional means, such as direct die pressing followed by sintering or injection molding followed by sintering. These parts may then be machined to final shape by grinding or Electro Discharge Machining operations (EDM), for example.

Figure 3:
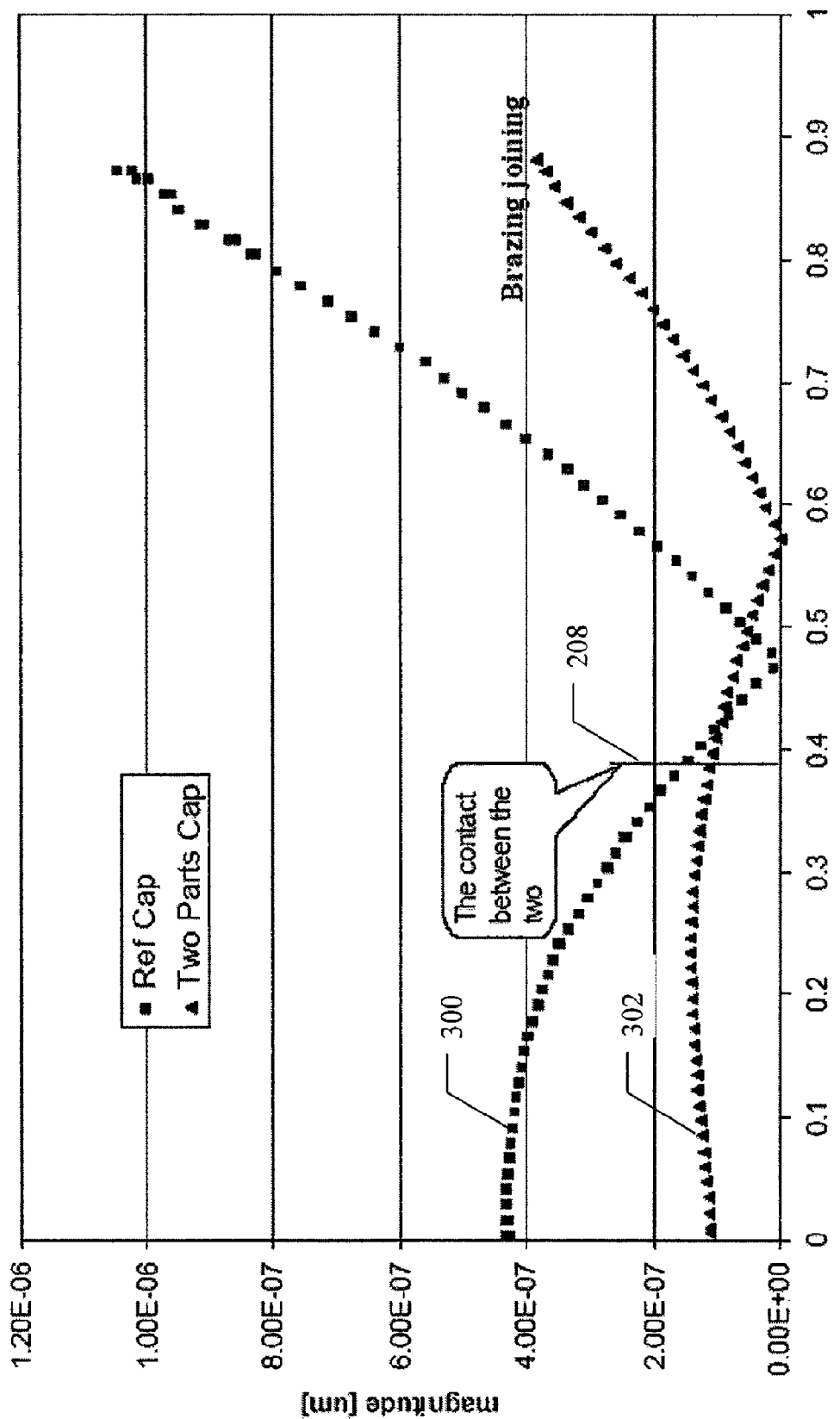
FIGS. 3-4 are graphs illustrating energy transition along the length of the exemplary bonding tool of the present invention.

FIG. 3 is a graph illustrating the displacement magnitude along the length of bonding tool 202. Curve 300 illustrates a conventional unitary piece bonding tool while curve 302 illustrates a bonding tool according to an exemplary embodiment of the present invention. As shown in FIG. 3, at point 208 there is a smooth transition where conical portion 206 is coupled to shaft 204.

Figure 4:
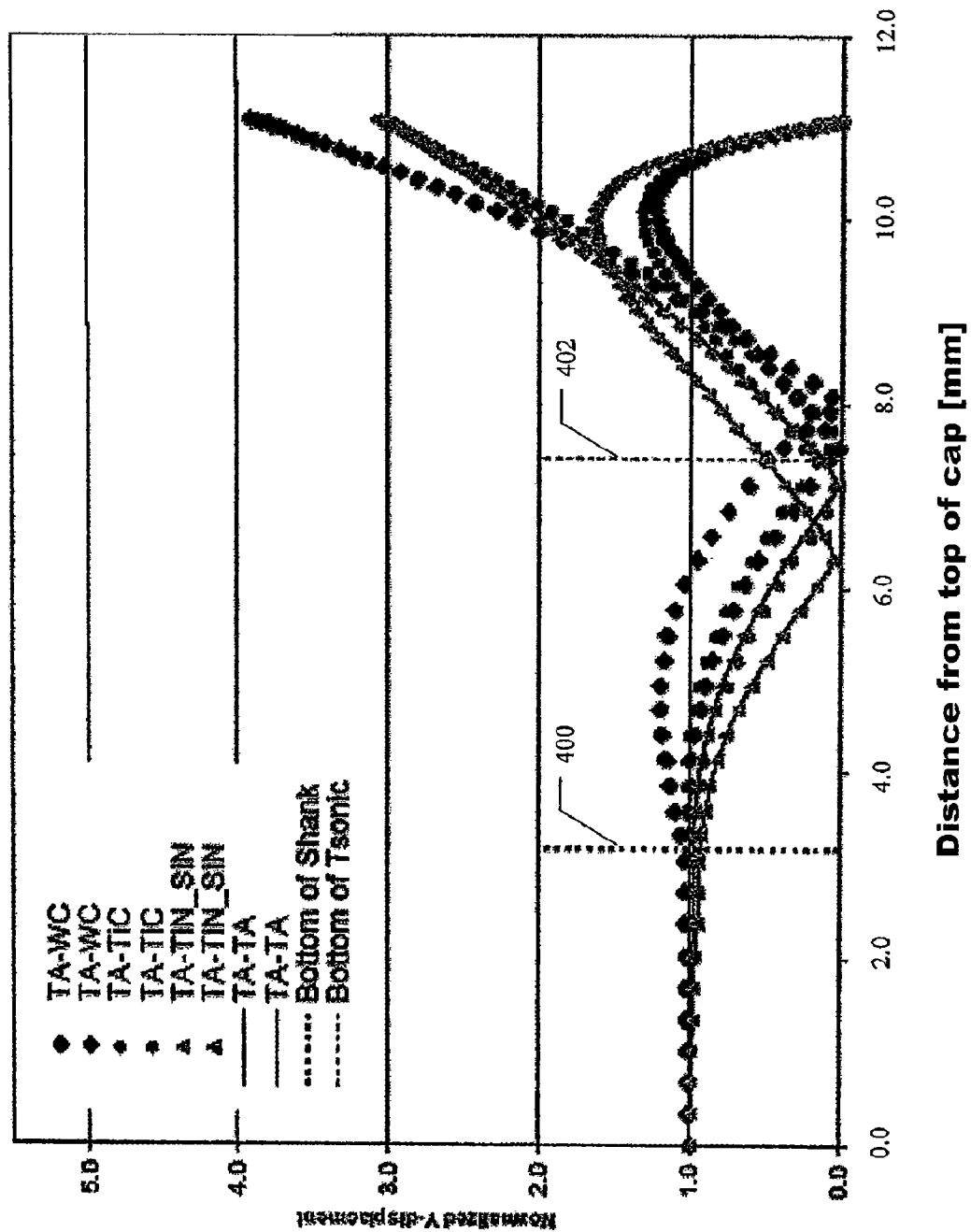
Figure 5:
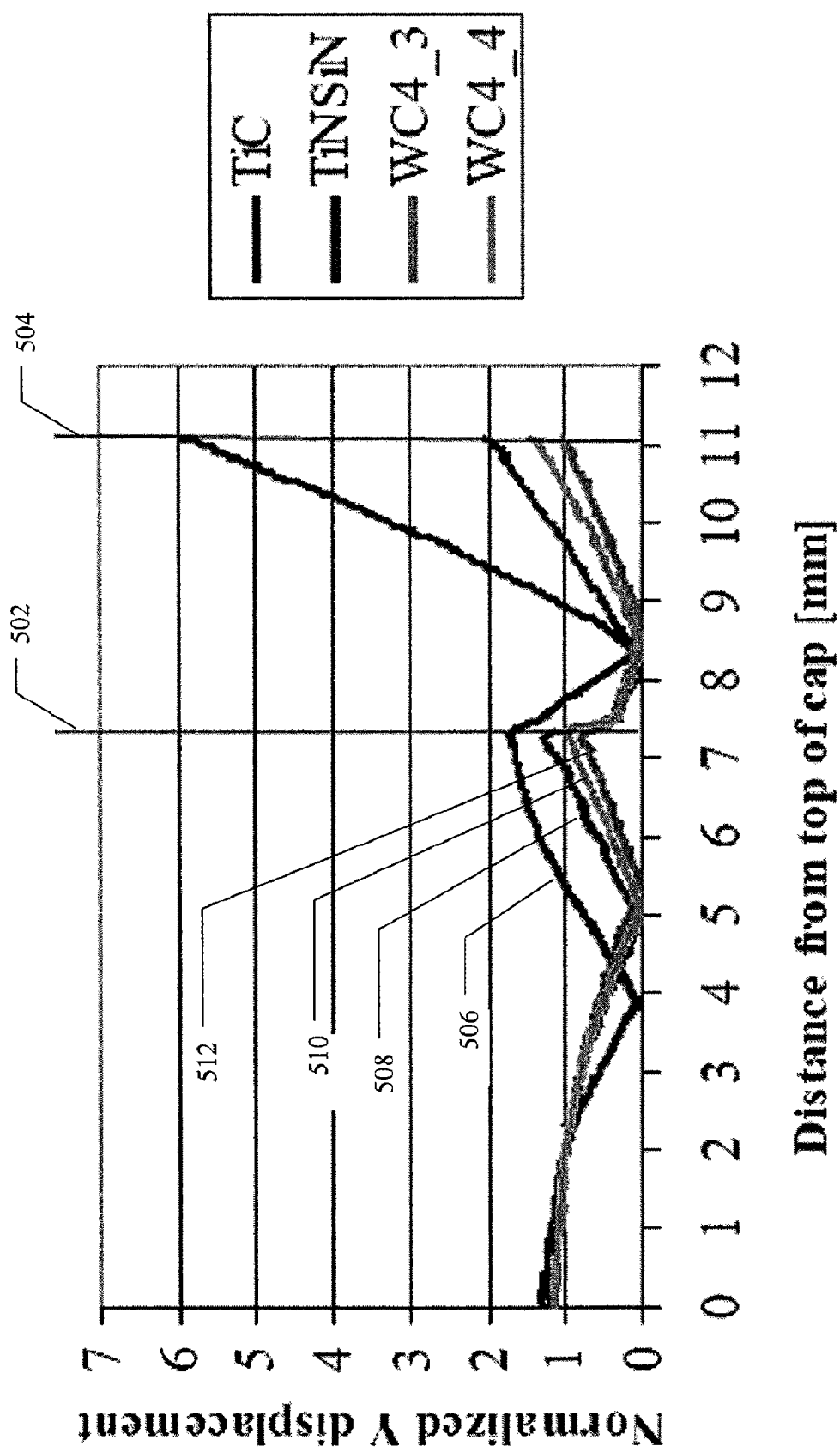
FIG. 5 is a graph plotting normalized Y displacement over the length of the exemplary bonding tool of the present invention.
Figure 6A:
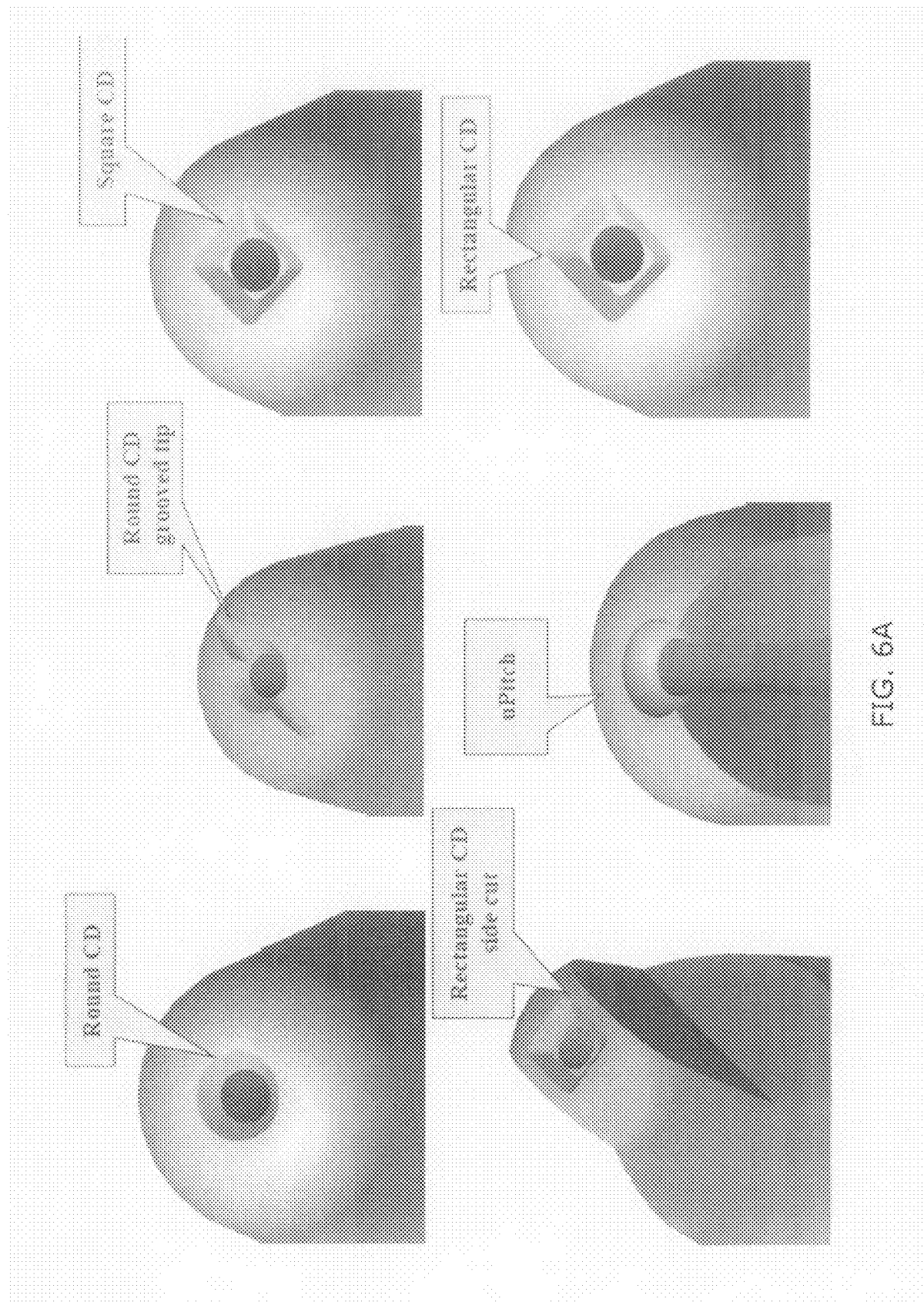
Figure 6H:
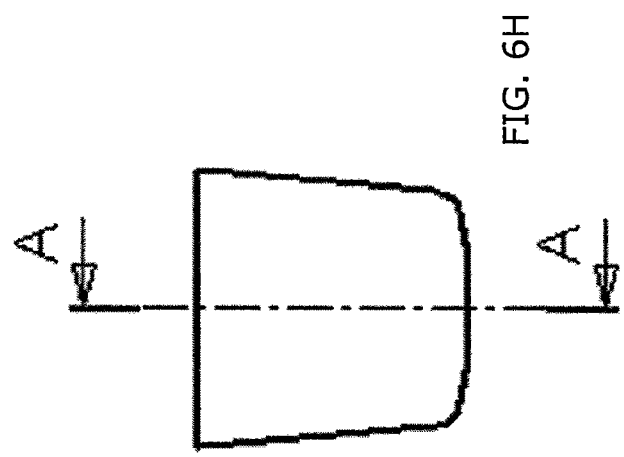
Figure 6I:
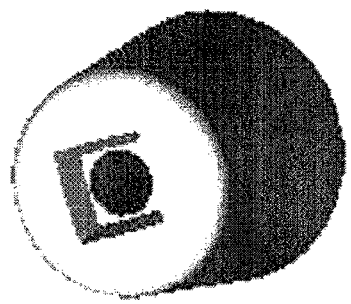
Figure 6F:
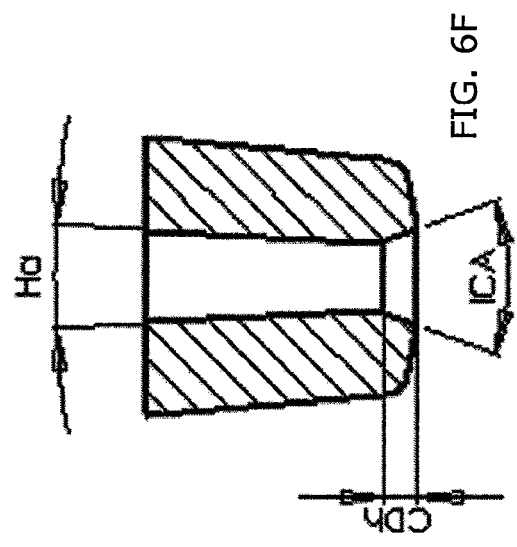
Figure 6G:
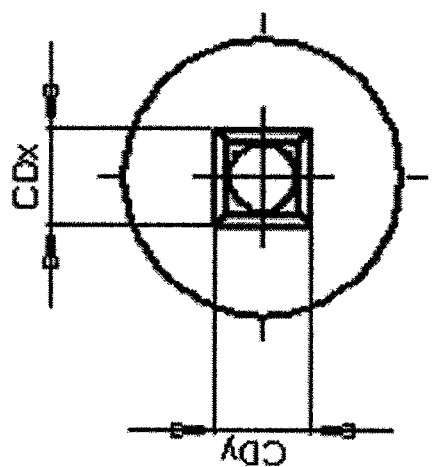

FIGS. 4 and 5 are other graphs illustrating the displacement magnitude along the length of bonding tool 202 for various material combinations. As illustrated in FIG. 4, point 400 is where shaft 204 of bonding tool 202 is coupled to an ultrasonic transducer (not shown) and point 402 (point 502 in FIG. 5) is where conical portion 206 is coupled to shaft portion 204. Once again, the transition between the shaft 204 and the conical portion 206 is smooth.

As discussed above, to enable ultra-fine pitch bonding where a high degree of inter metallic coverage (IMC) may be achieved, it is necessary to machine the tip portion 210 of bonding tool 202 to meet the particular application. The inventors have determined that certain tip features provide significant IMC in an ultra-fine pitch application. Several of these tip configurations are illustrated in FIGS. 6A-6I and 8-10. For example, tip portion 210 may have a substantially round chamfer, a substantially round chamfer with at least one groove traversing the round chamfer, a substantially round chamfer in combination with a micro-pitch tip, a substantially square chamfer, a substantially rectangular chamfer, and other geometric shaped chamfers. In one exemplary embodiment, side cuts are formed in conical portion 206 and adjacent the chamfered region of tip portion 210. These various tip features are now able to be formed because of the metallic based composition of the conical portion 206/tip portion 210.

FIGS. 6B-6I illustrate plan views, perspective views and sectional views of selected ones of the aforementioned examples. With respect to dimension of these features, the inventors have discovered that to ensure adequate IMC the following relationship is important:

If $CDx < \text{or} = CDy$ then $CDh = ((CDx-H)/2)*\tan(ICA/2)$

If $CDx > CDy$ then $CDh = ((CDy-H)/2)*\tan(ICA/2)$

Referring now to FIGS. 8A-8C, a portion of tip portion 810 according to an exemplary embodiment of the present invention is illustrated in an upward facing orientation; that is, the bottom portion of tip 810 is facing upward on the page. As shown in FIG. 8A, tip portion 810 has a frustum conical shape with an outer radius (OR) 812 at a bottom portion thereof. A range for radius 812 is between 2 microns and 50 microns. Adjacent an end of outer radius 812 is outer planar portion 814 which extends toward and is coupled to one end of arcuate inner chamfer 818. In turn, the other end of inner chamfer 818 is coupled to the lower portion of longitudinally extending orifice 822 having a diameter .O slashed.H. Inner chamfer 818 has a radius ICr of between about 3 and 30 microns and forms inner chamfer area 816 having an chamfer diameter (CD) measured across the face of tip portion 810 of between about .O slashed.H+(3-15) microns. Outer planar potion 814 is set at an angle, known as the face angle (FA) 828 of the bonding tool tip, of between about 0 and 15 degrees.

Referring now to FIG. 8B, a cross sectional view of FIG. 8A taken at section lines B-B is illustrated. As shown in FIG. 8B, and in greater detail in FIG. 8C, inner chamfer 818 has a radius ICr and a height ICh. As can be appreciated by those skilled in the art, by providing an inner chamber with a radius a greater mass of bonding material is presented to the bonding site (not shown). Ranges for ICr and ICh are between about 3 and 30, and 3 and 10, respectively.

Referring now to FIGS. 9A-9C, a portion of tip portion 910 according to another exemplary embodiment of the present invention is illustrated. As shown in FIG. 9A, tip portion 910 also has a frustum conical shape with an outer radius (OR) 912 at a bottom portion thereof. A range for OR 912 is between 2 microns and 50 microns. Adjacent an end of outer radius 912 is outer planar portion 914 which extends toward and is coupled to one end of planar inner chamfer 918. In turn, the other end of planar inner chamfer 918 is coupled to the lower portion of longitudinally extending orifice 922. Inner chamfer 918 forms inner chamfer area 916. Planar potion 914 is set at an angle known as the face angle (FA) 928 of the bonding tool tip of between about 0 and 15 degrees.

Referring now to FIG. 9B, a cross sectional view of FIG. 9A taken at section lines B-B is illustrated. As shown in FIG. 9B, and in greater detail in FIG. 9C, inner chamfer area 916 has a substantially rectangular or square profile, when viewed on end, with an inner chamfer angle ICA of between about 30 and 120 degrees. By providing an inner chamber with a rectangular or square profile, the bonding tool is better able to utilize most if not all of the surface of a rectangular or square boning pad. This is marked contrast to a circular bond placed or a square or rectangular pad. This is illustrated in FIG. 7.

Figure 7:
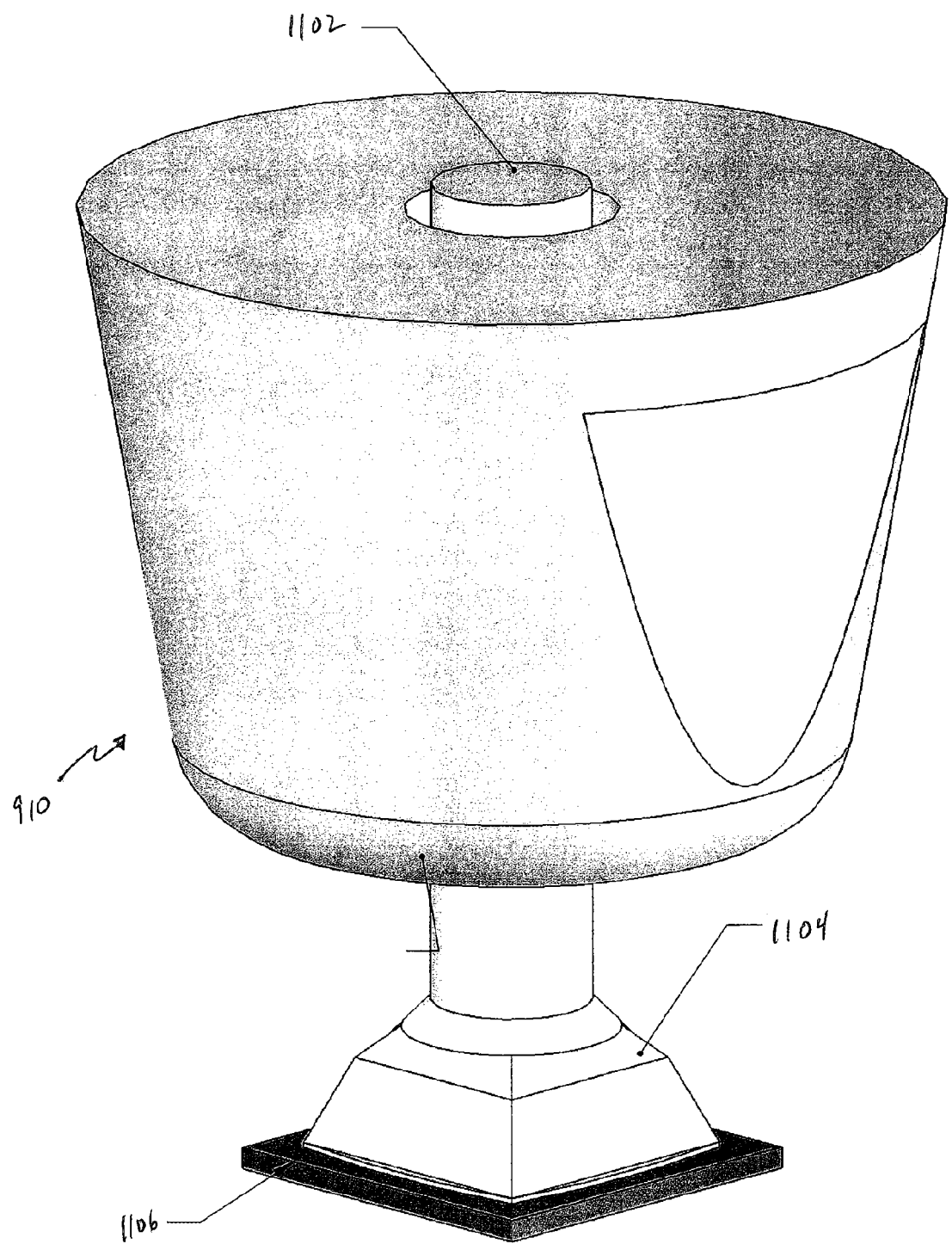
FIG. 7 illustrates a bond formed using a bonding tool tip according to an exemplary embodiment of the present invention.

FIG. 7 is a perspective view illustrating the greater utilization of the surface area of bond pad 1106 with a like shaped bond 1104 formed by bonding tool tip 910. The difference is easily determined from a comparison of the area of a circle versus the area of a square assuming that the diameter of the circle is equal to the length of a side of the square as follows:

$$(.PI./4)L.\sup.2 < L.\sup.2$$

Assuming that L=D, where L=length of side; D=diameter of circle, the use of a square bond yields about a 27% increase in surface area over that of a conventional circular bond.

Referring again to FIGS. 9A-9C, in one exemplary embodiment, a planar area 920 may be formed along opposite portions of tip 920. This provides clearance between bonds for ultra-fine pitch applications. Although illustrated as part of a square bond embodiment, the invention is not so limited. It is also contemplated that planar portions 920 may be used with bonding tool tips that form other bond profiles, such as round, rectangular, etc.

Referring now to FIGS. 10A-10C, a portion of tip portion 1010 according to another exemplary embodiment of the present invention is illustrated. As shown in FIG. 10A, tip portion 1010 has a frustum conical shape with a concave or inverted outer radius (OR) portion 1012 at a bottom portion thereof. A range for the radius of portion 1012 is between 2 microns and 30 microns. Adjacent an end of inverted outer radius portion 1012 is outer planar portion 1014 which extends toward and is coupled to one end of inner chamfer 1018. The point at which outer radius portion 1012 is coupled to outer planar portion 1014 forms an edge 1026 having an angle of between 0 and 15 degrees. In turn, the other end of inner chamfer 1018 is coupled to the lower portion of longitudinally extending orifice 1022. Inner chamfer 1018 forms inner chamfer area 1016. Outer planar portion 1014 has a face angle (FA) 1028 of between about 0 and 15 degrees. In one exemplary embodiment, inner chamfer 1018 has an arcuate profile. The invention is not so limited, however, in that it is contemplated that inner chamfer may have other profiles, such as the planar profile described above with respect to FIG. 9, or other conventional profiles.

Referring now to FIGS. 10B-10C, a cross sectional view of FIG. 10A taken at section lines B-B, and a plan view are illustrated, respectively. An advantage of this embodiment that edge 1026 improves the 2.sup.nd bond, typically a wedge bond, formed by bonding tip 1010, over conventional bonding tools.

Figure 11:
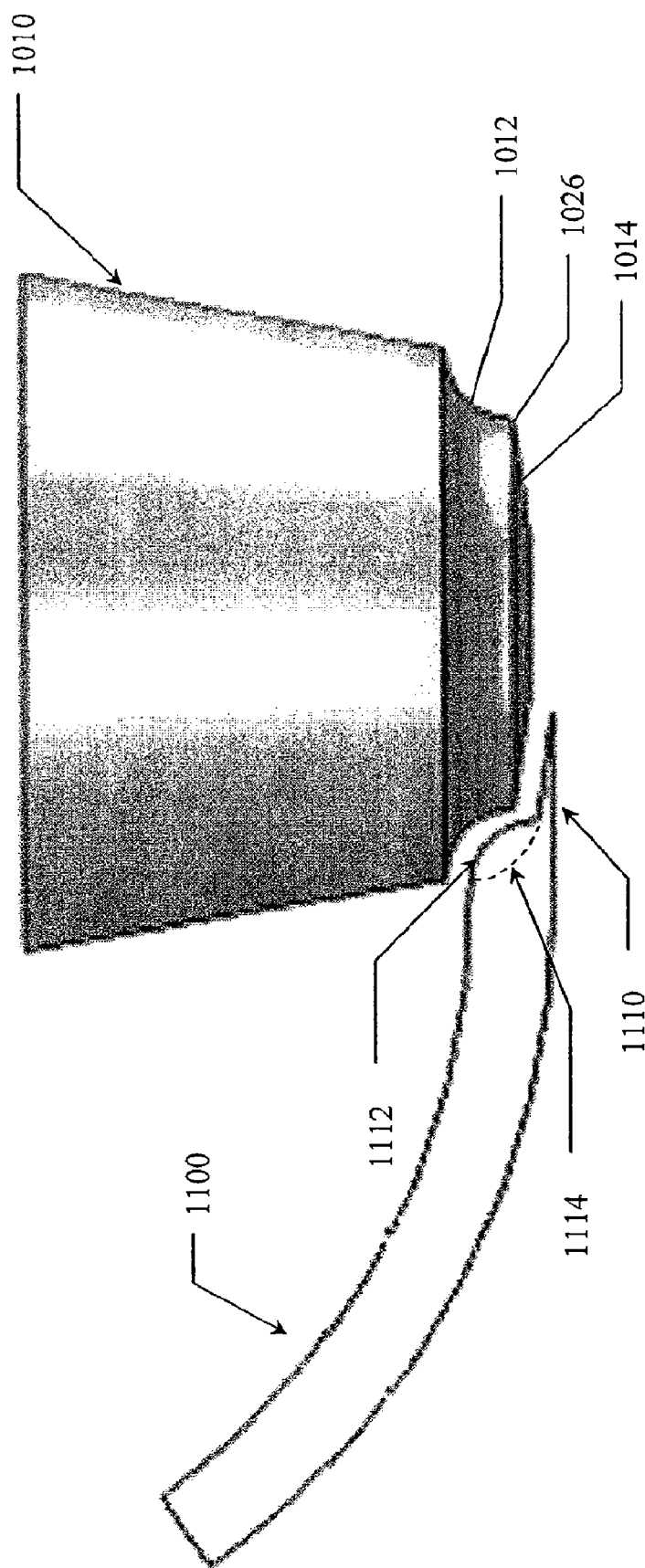
FIG. 11 illustrates a second bond formed using the bonding tool tip of FIG. 10.

FIG. 11 is a side view illustrating an improved 2.sup.nd bond 1110 formed by tip portion 1010 on bonding wire 1100. The difference in the 2.sup.nd bond 1110 (shown as solid lines including portion 1112) is easily seen in comparison to a 2.sup.nd bond formed by a conventional bonding tool (illustrated as dashed lines 1114). The inventors have found that by using an outer radius 1012 with a concave profile provides additional material (the material between solid line 1112 and dashed line 1114) for the 2.sup.nd bond, thus improving the adhesive property of the 2.sup.nd bond to a bonding site (not shown).

Although the invention has been described with reference to exemplary embodiments, it is not limited thereto. Rather, the appended claims should be construed to include other variants and embodiments of the invention which may be made by those skilled in the art without departing from the true spirit and scope of the present invention.

The invention claimed is:

1. A bonding tool for bonding a wire to a bonding location, the bonding tool comprising:
    a first portion formed from a first material, the first material being a non-conductive material, the first portion including a substantially cylindrical shaft portion being configured to be engaged with a transducer of a wire bonding machine; and
    a second portion formed from a second material, the second material being a conductive material, the second portion including a conical portion terminating at a tip portion of the bonding tool,
    the second portion being separate from, and configured to be connected to, the first portion at an interface between the shaft portion and the conical portion.

2. The bonding tool of claim 1 wherein a face portion of the tip portion defines a substantially square aperture.

3. The bonding tool of claim 1 wherein a face portion of the tip portion defines a substantially rectangular aperture.

4. The bonding tool of claim 1 wherein a face portion of the tip portion defines a substantially round aperture.

5. The bonding tool of claim 4 wherein the face portion defines a substantially linear groove across the substantially round aperture.

6. The bonding tool of claim 1 wherein the tip portion defines an inner chamfered portion, the inner chamfered portion having a substantially arcuate concave profile.

7. The bonding tool according to claim 6, wherein the inner chamfered portion has an interior radius of between about 5 microns and 30 microns.

8. The bonding tool of claim 1 wherein the tip portion defines an inner chamfered portion and defines a planar portion on a face of the tip portion adjacent the inner chamfered portion.

9. The bonding tool of claim 1 wherein the tip portion defines an inner chamfered portion, the inner chamfer having a substantially arcuate concave profile, the tip portion defining an exterior planar portion adjacent an end of the inner chamfer.

10. The bonding tool of claim 9 wherein the inner chamfered portion has a diameter of between about ØH+3 microns and ØH+15 microns as measured at a junction between the inner chamfered portion and the exterior planar portion, where ØH is the diameter of an orifice defined by the bonding tool, the orifice being configured to receive a length of wire to be bonded.

11. The bonding tool of claim 9 wherein the exterior planar portion of the tip portion has an angle of between about 0 and 15 degrees.

12. The bonding tool of claim 9 further defining an arcuate portion extending between an end of the exterior planar portion and a side surface of the tip portion.

13. The bonding tool of claim 12 wherein the arcuate portion has a radius of between about 2 and 50 microns.

14. The bonding tool of claim 1 comprising a plurality of substantially planar faces at an inner portion of the tip portion, the plurality of substantially planar faces defining a polygonal shape whereby the polygonal shape is defined along a cross-section of the tip portion.

15. The bonding tool of claim 14 wherein each of the plurality of substantially planar faces is positioned adjacent others of the plurality of substantially planar faces, and each of plurality of substantially planar faces is adjacent a terminal end of the tip portion.

16. The bonding tool of claim 14 wherein polygonal shape is a square shape.

17. The bonding tool of claim 14 wherein polygonal shape is a rectangular shape.

18. The bonding tool of claim 1 wherein the bonding tool defines a plurality of planar portions on at least a portion of a side surface of the tip portion.

19. The bonding tool of claim 18 wherein the plurality of planar portions includes at least two planar portions extending in a direction substantially parallel to a length direction of the bonding tool, wherein the length direction is the direction through which a wire is configured to be engaged in the bonding tool.

20. The bonding tool of claim 19 wherein the two planar portions are formed on opposite sides of the tip portion.

21. The bonding tool of claim 1 wherein the conical portion includes side cut portions formed adjacent the tip portion.

22. The bonding tool of claim 1 wherein the first portion is the substantially cylindrical shaft portion and the second portion is the conical portion.

23. The bonding tool of claim 1 wherein the first portion is configured to be connected to the second portion using at least one of an adhesive, brazing, heat, pressure, and threads.

24. The bonding tool of claim 23 wherein the first portion is configured to be connected to the second portion using at least one of an adhesive, brazing, heat, pressure, and threads.

* * * * *